United States Patent
Soma et al.

(10) Patent No.: US 7,166,813 B2
(45) Date of Patent: Jan. 23, 2007

(54) MULTISTEP SWITCH HAVING CAPACITIVE TYPE SENSOR

(75) Inventors: Masahiro Soma, Fukushima-ken (JP); Masahiro Takata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/286,881

(22) Filed: Nov. 22, 2005

(65) Prior Publication Data

US 2006/0113178 A1 Jun. 1, 2006

(30) Foreign Application Priority Data

Nov. 30, 2004 (JP) ............................. 2004-346087

(51) Int. Cl.
*H03K 17/975* (2006.01)

(52) U.S. Cl. ..................... 200/600; 200/341

(58) Field of Classification Search ........ 200/310–314, 200/341–345, 1 B, 600
See application file for complete search history.

(56) References Cited

U.S. PATENT DOCUMENTS

| | | | | |
|---|---|---|---|---|
| 2,430,286 A * | 11/1947 | Flegel et al. | ........... | 200/38 DA |
| RE30,923 E * | 5/1982 | Durkee et al. | .............. | 200/5 A |
| 4,438,304 A * | 3/1984 | Kennedy | ..................... | 200/406 |
| 4,598,181 A * | 7/1986 | Selby | .......................... | 200/5 A |
| 4,703,039 A * | 10/1987 | Hawiger et al. | .............. | 514/21 |
| 5,313,027 A * | 5/1994 | Inoue et al. | ................. | 200/5 A |
| 5,856,646 A * | 1/1999 | Simon | ........................ | 200/600 |
| 6,639,159 B1 * | 10/2003 | Anzai | ........................ | 200/1 B |
| 6,704,005 B1 | 3/2004 | Kato et al. | | |
| 6,784,382 B1 * | 8/2004 | Yanai et al. | ................. | 200/1 B |
| 6,936,777 B1 * | 8/2005 | Kawakubo | .................. | 200/1 B |
| 6,995,324 B1 * | 2/2006 | Asada | ......................... | 200/1 B |
| 7,075,020 B1 * | 7/2006 | Asada | ......................... | 200/1 B |
| 2005/0199475 A1 * | 9/2005 | Kawakubo | .................. | 200/1 B |

FOREIGN PATENT DOCUMENTS

JP    2003-331681 A2    11/2003

* cited by examiner

*Primary Examiner*—Michael Friedhofer
*Assistant Examiner*—Lisa Klaus
(74) *Attorney, Agent, or Firm*—Brinks Hofer Gilson & Lione

(57) ABSTRACT

A multistep switch includes a first input device, a second input device, and a third input device. The first input device is a capacitive type sensor. The second input device is disposed behind the first input device and capable of switching by pressure when the first input device is depressed. The third input device is disposed behind the second input device and capable of switching by pressure when the first input device is depressed and the second input device is depressed.

3 Claims, 1 Drawing Sheet

MULTISTEP SWITCH HAVING CAPACITIVE TYPE SENSOR

BACKGROUND OF THE INVENTION

1. Field of the Invention

The present invention relates to a multistep switch that can output three different signals when switched by an operator.

2. Description of the Related Art

Digital cameras and other various electronic devices have been employed with a multistep switch that is switched by an operator using two different strokes of a key or button. For example, giving the key or button a slight press switches on a first contact, and firmly pressing the key or button switches on a second contact.

Such a multistep switch has, for example, the following structure. A first contact is mounted on a movable body that can move up and down. A second contact is disposed under the movable body. When a key or button is depressed and moved to a predetermined position, a tactile spring disposed on the movable body switches on the first contact, and a first signal is output. When the key or button is further depressed with the first contact switched on, and thereby the movable body is lowered by a predetermined distance, another tactile spring disposed under the movable body switches on the second contact, and a second signal is output.

Japanese Unexamined Patent Application Publication No. 2003-331681 discloses another multistep switch including a capacitive or pressure-sensitive sensor (first input device) and a contact (second input device) disposed under the sensor. In such a multistep switch, when an object such as a finger touches the upper surface of the sensor, a first signal (coordinate signal) is output. When the upper surface of the sensor is pressed and the sensor is lowered by a predetermined distance, the contact is switched on and a second signal (pressing signal) is output.

Recent electronic devices have a variety of functions. Accordingly, many switches (input devices) are needed to operate the electronic devices.

However, if many switches are provided in electronic devices, a large space is necessary. This prevents electronic devices from being downsized. In addition, if many switches are provided in electronic devices, operation becomes complicated and the electronic devices become less user-friendly and more expensive.

SUMMARY OF THE INVENTION

The present invention is made in consideration of the above situation. It is an object of the present invention to provide a multistep switch (input device) with which an operator can perform three or more different input operations.

In an aspect of the present invention, a multistep switch includes a first input device, a second input device, and a third input device. The first input device is a capacitive type sensor. The second input device is disposed behind the first input device and capable of switching by pressure when the first input device is depressed. The third input device is disposed behind the second input device and capable of switching by pressure when the first input device is depressed and the second input device is depressed.

Owing to the above structure, three operations of an electronic device can be performed with a single switch.

Since many operations can be performed with a single switch, if an electronic device has a complex function, a large space for disposing many switches is not necessary and therefore the electronic device can be downsized. In addition, the electronic device can be simple in design and user-friendly.

The multistep switch of the present invention may further include a flexible sheet including an S-shaped folded portion. In this case, the first input device is disposed on the upper surface of an upper segment of the folded portion. The second input device is disposed on the upper surface of a middle segment of the folded portion. The third input device is disposed on the upper surface of a lower segment of the folded portion. The first, second, and third input devices are disposed in the same position as viewed from above.

Alternatively, the second input device and the third input device may constitute a two-stage switch disposed on a board. In this case, the first input device is disposed on the upper surface of a flexible sheet, for example. The sheet is disposed above the two-step switch. The first, second, and third input devices are disposed in the same position as viewed from above.

DESCRIPTION OF THE PREFERRED EMBODIMENTS

The preferred embodiments of the present invention will now be described with reference to the drawings.

The multistep switch of the present invention is suitable for performing a series of three operations in electronic devices. The multistep switch includes a first input device, a second input device, and a third input device. The first input device is a capacitive type sensor. The second input device is disposed behind the first input device and capable of switching by pressure when the first input device is depressed. The third input device is disposed behind the second input device and capable of switching by pressure when the first input device is depressed and the second input device is depressed.

Figure 1:
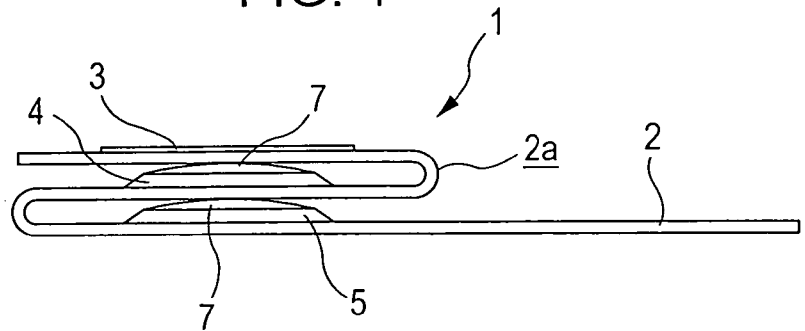
FIG. 1 is a schematic front view showing a multistep switch according to a first embodiment of the present invention.

FIG. 1 is a schematic front view showing a multistep switch according to a first embodiment of the present invention.

The multistep switch 1 of the first embodiment of the present invention includes a wiring board 2 formed of a flexible sheet and having an S-shaped folded portion 2a. A capacitive type sensor 3 (hereinafter referred to as "capacitive sensor 3") is disposed on the upper surface of an upper segment of the folded portion 2a of the wiring board 2. The capacitive sensor 3 serves as a first input device used for a first input operation. A switch 4 (hereinafter referred to as "second switch 4") is disposed on the upper surface of a middle segment of the folded portion 2a of the wiring board 2. The second switch 4 serves as a second input device used for a second input operation. Another switch 5 (hereinafter referred to as "third switch 5") is disposed on the upper surface of a lower segment of the folded portion 2a of the wiring board 2. The third switch 5 serves as a third input device used for a third input operation. The input devices, that is to say, the capacitive sensor 3, the second switch 4, and the third switch 5 are disposed in the same position as viewed from above.

The wiring board 2 is formed of a resin sheet, for example, a flexible printed circuit (hereinafter referred to as "FPC"). An FPC is a thin sheet having a multilayer structure in which a foil is sandwiched between a base film and a cover film. The foil is formed of copper, nickel, or gold and has a circuit pattern of electrodes (conductors). The base film and the cover film are insulating substrates formed of, for example, polyimide or epoxy resin. The wiring board 2 is folded in an S-shape, in other words, has an S-shaped folded portion 2a. The capacitive sensor 3 is disposed on the upper surface of the upper segment of the S-shaped folded portion 2a (on a first side of the wiring board 2). The second switch 4 is disposed on the upper surface of the middle segment of the S-shaped folded portion 2a (on a second side of the wiring board 2). The third switch 5 is disposed on the upper surface of the lower segment of the S-shaped folded portion 2a (on the first side of the wiring board 2). The capacitive sensor 3, the second switch 4, and the third switch 5 are connected to the circuit pattern of electrodes. The wiring board 2 has a rigidity such that the distances between the upper, middle, and lower segments of the S-shaped folded portion 2a are kept constant when the multistep switch is not depressed, and the S-shaped folded portion 2a is elastically deformed so as to depress the switches 4 and 5 when the multistep switch is depressed.

The capacitive sensor 3 (first input device) includes electrodes, lands, and a sheet. The electrodes and lands are formed of a silver-base paste. The sheet is formed of an insulating material having a predetermined dielectric constant (e.g., polyethylene terephthalate (PET)). The electrodes and lands are formed on the upper surface of the sheet. The sheet is disposed on the wiring board 2. The electrodes of the capacitive sensor 3 are connected to the circuit pattern of the wiring board 2.

When a dielectric (e.g., a finger) touches the surface of the capacitive sensor 3, capacitance changes at the positions where the lands are formed. By monitoring this change in capacitance, whether there is an input operation can be determined.

When the operator depresses the capacitive sensor 3, the second switch 4 can perform a switching operation by the pressure. When the operator depresses the capacitive sensor 3 and the switch 4, the third switch 5 can perform switching operation by the pressure.

The second switch 4 and the third switch 5 each includes a fixed contact (not shown), a plurality of external fixed contacts (not shown) located around the fixed contact, and a pattern (not shown) led out from the fixed contacts. The fixed contact, the external fixed contacts, and the pattern are printed on the wiring board 2. In addition, the second switch 4 and the third switch 5 each includes a tactile spring 7. The tactile spring 7 is mounted on the wiring board 2. The periphery of the tactile spring 7 is held by a holding sheet (not shown). The tactile spring 7 is always in contact with the external fixed contacts. The tactile spring 7 can be inverted and functions as a metallic contact (movable contact).

The fixed contacts of the second switch 4 are disposed on the second side of the wiring board 2 and electrically connected to the circuit pattern of the wiring board 2. The fixed contacts of the third switch 5 are disposed on the first side of the wiring board 2 and electrically connected to the circuit pattern of the wiring board 2.

To operate the multistep switch of the present embodiment, the operator touches the surface of the capacitive sensor 3 (first input device) with a dielectric (e.g., a finger). Capacitance at the touched position changes, and a first signal is output (function of the first input device).

The capacitive sensor 3 is then depressed. Together with the capacitive sensor 3, the upper segment of the folded portion 2a, on which the capacitive sensor 3 (first input device) is disposed, is depressed. The lower surface of the upper segment comes into contact with the center of the upper surface of the tactile spring 7 constituting the second switch 4. The center of the upper surface is inverted to be in contact with the fixed contact. The fixed contact is connected to the external fixed contacts by the tactile spring 7, and a second signal is output (function of the second input device).

The capacitive sensor 3 is then further depressed. The middle segment as well as the upper segment is depressed. The lower surface of the middle segment comes into contact with the center of the upper surface of the tactile spring 7 constituting the third switch 5. The center of the upper surface is inverted to be in contact with the fixed contact. The fixed contact is connected to the external fixed contacts by the tactile spring 7, and a third signal is output (function of the third input device).

As described above, the multistep switch of the first embodiment has a relatively simple structure and can output signals concerning three different operations.

Figure 2:
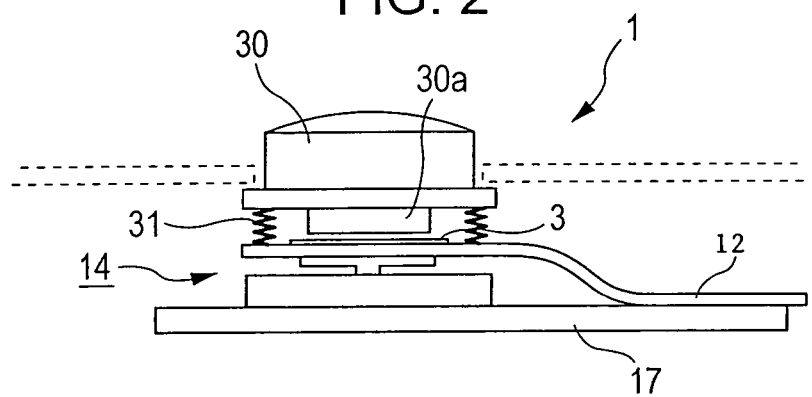
FIG. 2 is a schematic front view showing a multistep switch according to a second embodiment of the present invention.

FIG. 2 is a schematic front view showing a multistep switch according to a second embodiment of the present invention.

The multistep switch of the second embodiment of the present invention has the following structure. A two-step switch 14 is disposed on a wiring board 17. The two-step switch 14 includes a second switch 4 (second input device) and a third switch 5 (third input device). A capacitive sensor 3 (first input device) is disposed over the two-step switch 14. The capacitive sensor 3 is mounted on the upper surface of another wiring board 2 formed of a flexible resin sheet. The input devices, that is to say, the capacitive sensor 3, the second switch 4, and the third switch 5 are disposed in the same position as viewed from above.

Known two-step switches can be used as the two-step switch 14 of the multistep switch according to the second embodiment.

Figure 3:
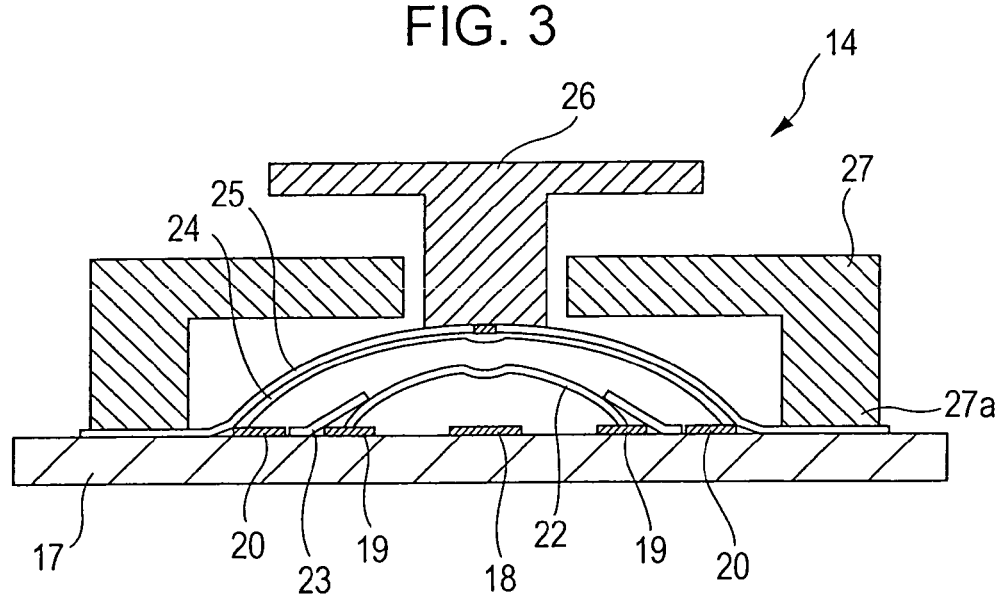
FIG. 3 is a sectional view showing the structure of a two-step switch constituting the multistep switch of the second embodiment of the present invention.

FIG. 3 shows an example of the structure of the two-step switch 14. An internal fixed contact 18, a plurality of first external fixed contacts 19, a plurality of second external fixed contacts 20, and a pattern (not shown) are printed on the wiring board 17. The plurality of first external fixed contacts 19 are located around the internal fixed contact 18. The plurality of second external fixed contacts 20 are located around the plurality of first external fixed contacts 19. The pattern is led out from the fixed contacts 18, 19, and 20. In addition, a first tactile spring 22 is mounted on the wiring board 17. The periphery of this first tactile spring 22 is held by a first holding sheet 23. The first tactile spring 22 is always in contact with the first external fixed contacts 19. The first tactile spring 22 can be inverted and functions as a metallic contact (movable contact). In addition, a second tactile spring 24 is mounted on the wiring board 17. The diameter of the second tactile spring 24 is larger than that of the first tactile spring 22. The second tactile spring 24 is always in contact with the second external fixed contacts 20. The second tactile spring 24 can be inverted and functions as a metallic contact. The larger second tactile spring 24 is disposed so as to cover the smaller first tactile spring 22. A second holding sheet 25 covers and holds the second tactile spring 24. When the center of the second tactile spring 24 is inverted, the second tactile spring 24 comes into contact with the first tactile spring 22. When the center of the first tactile spring 22 is inverted, the first tactile spring 22 comes into contact with the internal fixed contact 18. An operating member 26 is disposed over the second holding sheet 25 covering the second tactile spring 24. The operating member 26 can move up and down. A supporting case 27 supports this operating member 26. The foot portion 27a of the supporting case 27 holds down the periphery of the second holding sheet 25 on the wiring board 17. The first tactile spring 22, the second tactile spring 24, and the first external fixed contacts 19, and the second external fixed contacts 20 correspond to the second input device. The first tactile spring 22, the internal fixed contact 18, and the first external fixed contacts 19 correspond to the third input device.

The capacitive sensor 3 (first input device) includes electrodes, lands, and a sheet. The electrodes and lands are formed of a silver-base paste. The sheet is formed of an insulating material having a predetermined dielectric constant (e.g., polyethylene terephthalate (PET)). The electrodes and lands are formed on the upper surface of the sheet. The sheet is disposed on the wiring board 2. The wiring board 2 is a flexible resin sheet including a conductive pattern. The electrodes of the capacitive sensor 3 are connected to a conductive pattern of the wiring board 17.

As shown in FIG. 2, a key top 30 is disposed over the first input device. The key top 30 is a dielectric. The lower surface of the key top 30 faces the upper surface of the capacitive sensor 3 (first input device). A projection 30a is formed on the lower surface of the key top 30. When the key top 30 is depressed, the projection 30a comes into contact with the upper surface of the capacitive sensor 3. The key top 30 is positioned over the capacitive sensor 3 by springs 31, which are disposed between the key top 30 and the first input device. The key top 30 is movably supported by a case of an electronic device (shown by dashed line in FIG. 2). When the key top 30 is not depressed, a clearance is formed between the projection 30a and the capacitive sensor 3. When the key top 30 is depressed, the projection 30a comes into contact with the capacitive sensor 3.

To operate the multistep switch 1 of the present embodiment, the operator brings the projection 30a of the key top 30, which is a dielectric, into contact with the surface of the capacitive sensor 3 (first input device). Capacitance at the touched position changes, and a first signal is output (function of the first input device).

The capacitive sensor 3 is then depressed. Together with the capacitive sensor 3, the wiring board 12, on which the capacitive sensor 3 (first input device) is disposed, is depressed. When the operating member 26 of the two-step switch 14 is lowered by a predetermined distance, the center of the second tactile spring 24 is inverted to be in contact with the first tactile spring 22. At this time, the second holding sheet 25 also elastically deforms into the same shape as the second tactile spring 24. When the second tactile spring 24 comes into contact with the first tactile spring 22, the first external fixed contacts 19 are connected to the second external fixed contacts 20, and therefore a second signal is output (function of the second input device).

The operating member 26 is then further lowered. Pressed by the inverted second tactile spring 24, the center of the first tactile spring 22 is inverted. The first tactile spring 22 comes into contact with the internal fixed contact 18. Therefore, the internal fixed contact 18 is connected to the first external fixed contacts 19 by the first tactile spring 22, and a third signal is output (function of the third input device).

As described above, the multistep switch of the second embodiment has a relatively simple structure and can output signals concerning three different operations.

The case where the multistep switch of the present invention is used in an electronic device, for example, an auto focus digital camera will be described. Touching the capacitive sensor 3 (first input device) turns on the digital camera. Next, depressing the second switch 4 (second input device) makes the digital camera perform auto focusing and focus locking. Finally, depressing the third switch 5 (third input device) releases the shutter. In this way, a series of three operations of the electronic device can be performed with a single switch.

Since many operations can be performed with a single switch, if an electronic device has a complex function, a large space for disposing many switches is not necessary and therefore the electronic device can be downsized. The electronic device having this multistep switch can be simple in design and user-friendly.

The present invention is not intended to be limited to the above-described embodiments, and various changes may be made therein if necessary.

What is claimed is:

1. A multistep switch comprising:
a first input device that is a capacitive type sensor;
a second input device disposed behind the first input device and capable of switching by pressure when the first input device is depressed; and
a third input device disposed behind the second input device and capable of switching by pressure when the first input device is depressed and the second input device is depressed.

2. The multistep switch according to claim 1, further comprising a flexible sheet comprising an S-shaped folded portion, wherein the first input device is disposed on the upper surface of an upper segment of the folded portion, the second input device is disposed on the upper surface of a middle segment of the folded portion, the third input device is disposed on the upper surface of a lower segment of the folded portion, and the first, second, and third input devices are disposed in the same position as viewed from above.

3. The multistep switch according to claim 1, further comprising a flexible sheet and a board, wherein the first input device is disposed on the upper surface of the sheet, the second input device and the third input device constitute a two-stage switch, the two-stage switch is disposed on the board, the sheet is disposed above the two-step switch, and the first, second, and third input devices are disposed in the same position as viewed from above.

* * * * *